US011187268B2

(12) United States Patent
Peijnenburg et al.

(10) Patent No.: US 11,187,268 B2
(45) Date of Patent: Nov. 30, 2021

(54) MAGNETIC BEARING ASSEMBLY AS WELL AS A LINEAR GUIDEWAY ASSEMBLY IMPLEMENTING ONE OR MORE SUCH MAGNETIC BEARING ASSEMBLIES

(71) Applicant: VDL Enabling Technologies Group B.V., Eindhoven (NL)

(72) Inventors: Antonius Theodorus Adrianus Peijnenburg, Eindhoven (NL); Rick Baade, Eindhoven (NL)

(73) Assignee: VDL Enabling Technologies Group B.V., Eindhoven (NL)

( * ) Notice: Subject to any disclaimer, the term of this patent is extended or adjusted under 35 U.S.C. 154(b) by 0 days.

(21) Appl. No.: 16/758,440

(22) PCT Filed: Oct. 26, 2018

(86) PCT No.: PCT/NL2018/050713
§ 371 (c)(1),
(2) Date: Apr. 23, 2020

(87) PCT Pub. No.: WO2019/083369
PCT Pub. Date: May 2, 2019

(65) Prior Publication Data
US 2020/0248747 A1    Aug. 6, 2020

(30) Foreign Application Priority Data
Oct. 26, 2017   (NL) ..................................... 2019812

(51) Int. Cl.
*F16C 32/04*   (2006.01)
(52) U.S. Cl.
CPC ................. *F16C 32/0472* (2013.01)
(58) Field of Classification Search
CPC .... B23Q 1/58; B23Q 11/0032; B23Q 15/013; B23Q 3/02; B23Q 5/28; F16C 29/025;
(Continued)

(56) References Cited

U.S. PATENT DOCUMENTS

| 5,196,745 A | 3/1993 | Trumper |
| 5,360,470 A | 11/1994 | Ono |

(Continued)

FOREIGN PATENT DOCUMENTS

| EP | 2 714 325 B1 | | 4/2016 |
| WO | WO 2007057842 | * | 5/2007 |
| WO | WO 2019/083369 A1 | | 5/2019 |

OTHER PUBLICATIONS

International Search Report and Written Opinion in International Application No. PCT/NL2018/050713 dated Feb. 5, 2019 (11 pages).

*Primary Examiner* — Ahmed Elnakib
(74) *Attorney, Agent, or Firm* — Nixon Peabody LLP

(57) ABSTRACT

The invention relates to a magnetic bearing assembly for contactless linear displacement of a rigid body relative to another rigid body along a linear displacement path.

The invention also relates to a linear guideway assembly implementing one or more such magnetic bearing assemblies.

The invention aims to provide a solution for the above identified problems, allowing linear displacement of a rigid body relative to another rigid body along a linear displacement path and in particular allowing control of a translational degree of freedom of a rigid body relative to another rigid body, said magnetic bearing assembly comprising:

at least one magnetic bearing module being mounted to one of said rigid bodies and consisting of at least:
a ferromagnetic core;
a first magnetic element positioned on a first side of said ferromagnetic core;
a coil being wound around said ferromagnetic core;
(Continued)

at least a first static back iron being mounted to the other one of said rigid bodies and positioned, during use, at some gap distance from said one bearing module.

9 Claims, 6 Drawing Sheets

(58) Field of Classification Search
CPC .. F16C 32/0674; F16C 2322/39; F16C 29/00; F16C 32/0434; F16C 32/047; F16C 32/0472; F16C 32/0465; H02K 41/03; H02K 41/035
USPC ................................................ 310/60.5, 90.5
See application file for complete search history.

(56) References Cited

U.S. PATENT DOCUMENTS

| | | | |
|---|---|---|---|
| 5,732,636 A * | 3/1998 | Wang | B60L 13/06 |
| | | | 104/284 |
| 6,353,271 B1 * | 3/2002 | Williams | G03F 7/707 |
| | | | 310/12.06 |
| 2014/0076207 A1 * | 3/2014 | Ro | F16C 29/025 |
| | | | 108/20 |
| 2017/0040868 A1 * | 2/2017 | Noh | F04D 13/064 |

* cited by examiner

MAGNETIC BEARING ASSEMBLY AS WELL AS A LINEAR GUIDEWAY ASSEMBLY IMPLEMENTING ONE OR MORE SUCH MAGNETIC BEARING ASSEMBLIES

CROSS-REFERENCE TO RELATED APPLICATIONS

This application is a U.S. National Stage Entry of International Application No. PCT/NL2018/050713, filed Oct. 26, 2018, which claims priority to Netherlands Application No. NL2019812, filed Oct. 26, 2017, the contents of which are herein incorporated by reference in their entirety.

FIELD OF THE INVENTION

The invention relates to a magnetic bearing assembly for contactless linear displacement of a rigid body relative to another rigid body along a linear displacement path.

The invention also relates to a linear guideway assembly implementing one or more such magnetic bearing assemblies.

BACKGROUND OF THE INVENTION

Magnetic bearing assemblies or in short magnetic bearings could provide an advantageous alternative to conventional rolling element bearings. Given that magnetic bearings are contactless, there is no mechanical friction and thus very little particle generation. Moreover, there is no need for lubrication which enables in vacuum operation without significant outgassing of molecular contamination. These aspects make that contamination seals can be omitted. The main challenges of applying magnetic bearings in high-tech in-vacuum systems lie in minimization of heat dissipation in the coils, minimizing eddy-current effects, implementation of a stable control system and linearization of the typically non-linear characteristics.

Magnetic bearing technology is already utilized in industrial applications. Rotary magnetic bearings are commercially available and applied in for example medical systems, turbo molecular vacuum pumps, cryogenic systems and machine tools. Another category are bearingless motors, where the rotor is magnetically suspended. Magnetic levitation is widely used in the actuation of planar stages, typically based on Lorentz forces. A separate type of magnetic bearings is based on reluctance forces, wherein a similar concept can also be used as actuator.

Although utilized in other fields, further development of magnetic bearing applications on a commercial scale in for example high cleanliness substrate handling robotics suffer from technological and constructional constraints. Commonly known magnetic bearing applications are characterized by their limited design dimensions, whereas upscale implementation of magnetic bearing applications require the development of magnetic bearings of significant weight, size and cost, whereas conventional rolling element bearings are still available for similar purposes.

DESCRIPTION OF THE INVENTION

The invention aims to provide a solution for the above identified problems, allowing linear displacement of a rigid body relative to another rigid body along a linear displacement path and in particular allowing control of a translational degree of freedom of a rigid body relative to another rigid body, said magnetic bearing assembly comprising:

at least one magnetic bearing module being mounted to one of said rigid bodies and consisting of at least:
a ferromagnetic core;
a first magnetic element positioned on a first side of said ferromagnetic core;
a coil being wound around said ferromagnetic core;
at least a first static back iron being mounted to the other one of said rigid bodies and positioned, during use, at some gap distance from said one bearing module.

As such a magnetic bearing assembly is obtained, which allows a contactless linear displacement of a rigid body relative to another rigid body, without friction, which results in no particle generation or outgassing of lubricants. In particular a linear displacement of the rigid bodies relative to each other is herewith possible perpendicular to the direction of stiffness of the whole construction.

In an example of the magnetic bearing assembly said first static back iron is positioned at the first side of the ferromagnetic core.

In yet a further advantageous embodiment the magnetic bearing module further consists of a setting module positioned on another side of the ferromagnetic core opposite to the first side. The active bearing module consists of an e-core, a permanent magnet and a coil. A second magnetic element is positioned on the rigid body where the magnetic force acts in opposite direction of the active bearing module to provide preload and static force balance. Where one of both elements is mechanically adjustable with respect to the other for tuning of the force balance in steady-state and compensate for tolerance (e.g. permanent magnet tolerance). An additional advantage of this configuration is no power dissipation in steady-state conditions. This allows a further setting possibility of the magnetic bearing module by applying a constant pre-load in the direction opposite to that of the attraction force towards the first static back iron as generated by the ferromagnetic core and the first magnetic element, thereby controlling the gap distance between both rigid bodies and as such the contactless linear displacement of said rigid bodies relative to each other with zero heat dissipation. In particular with the implementation of the setting module the net force exerted in static conditions on the magnetic bearing module can be controlled, and thereby also the position (the gap distances) of the magnetic bearing module (the one rigid body) relative to the other rigid body.

In particular said setting module comprises a second magnetic element allowing an enhanced control of the net force exerted on the magnetic bearing module can be controlled, and thereby also the position (the gap distances) of the magnetic bearing module (the one rigid body) relative to the other rigid body.

In a further example of the magnetic bearing assembly according to the invention said at least one bearing module comprises a further static back iron being mounted to the other one of said rigid bodies and positioned, during use, at some gap distance from said setting module, wherein said setting module is arranged in setting said gap distance between the bearing module and said further static back iron being mounted to the other one of said rigid bodies.

In particular said setting module is a controllable setting module, thereby allowing a presetting of the constant pre-load in the direction opposite to that of the attraction force towards the first static back iron as generated by the ferromagnetic core and the first magnetic element. This allows a further controlling of the gap distance between both rigid bodies and as such the contactless linear displacement of said rigid bodies relative to each other. In particular with the implementation of a pre-setting of the setting module the net force exerted on the magnetic bearing module can be further controlled in dependence of the application or construction wherein the magnetic bearing modules is implemented, and thereby also the position (the gap distances) of the magnetic bearing module (the one rigid body) relative to the other rigid body to statically balance forces and minimize energy dissipation.

In further examples the ferromagnetic core is an E-core having a base, a center leg and two outer legs, wherein the first magnetic element positioned on the central leg, and wherein the coil is wound around the center leg.

In particular the E-core is a laminated E-core and the first magnetic element is a permanent magnet. Also the second magnetic element can be a permanent magnet.

An example of an application or implementation of one or more magnetic bearing assemblies according to the invention can be a linear guideway assembly being composed of a rigid body formed as a linear guideway defining a linear displacement path as well as one or more rigid bodies formed as product carriers being displaceable along said linear guideway, wherein said linear guideway assembly further comprises one or more of such magnetic bearing assemblies.

BRIEF DESCRIPTION OF THE DRAWINGS

The invention will now be described in more detail with reference to the accompanying drawings, which drawings show in:

FIG. 3b a side view of FIG. 3a;

DETAILED DESCRIPTION OF THE DRAWINGS

Figure 1:
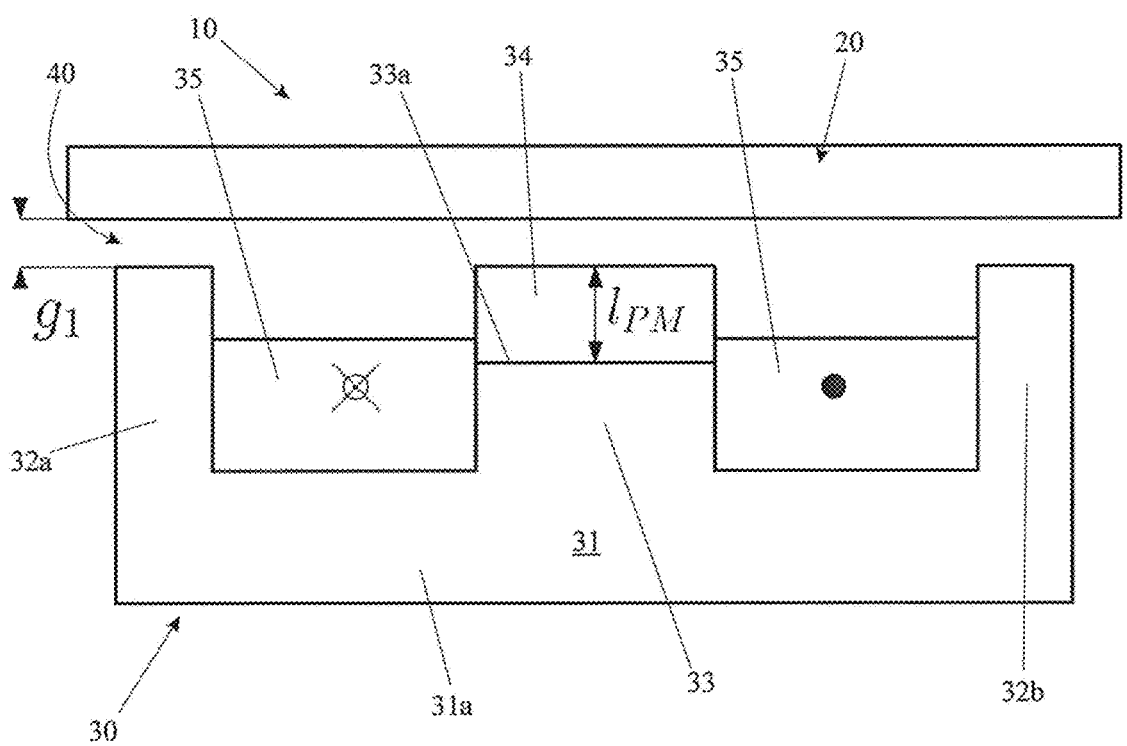
FIG. 1 a schematic example of an embodiment of a magnetic bearing assembly according to the invention.

For a better understanding of the invention like parts in the drawings are denoted with like reference numerals. The proposed concepts of a magnetic bearing assembly as depicted in the attached drawings consist of small bearing elements, which constrain a single translational degree of freedom of one rigid body with respect to another rigid body. It is to be noted that multiple bearing elements can be combined to constrain or control multiple degrees of freedom, as for example shown in the embodiment of FIGS. 3a and 3b.

A first schematic example of a variable reluctance magnetic bearing assembly according to the invention is depicted in FIG. 1. The magnetic bearing assembly of the example of FIG. 1 is denoted with reference numeral 10 (reference numeral 10' in FIGS. 2a-2b) and allows a contactless linear displacement (or a single translational degree of freedom) of a rigid body relative to another rigid body along a linear displacement path. In FIG. 1 one of said rigid bodies is denoted with reference numeral 30 (as well as in FIGS. 2a-2b and as reference numeral 300 in FIGS. 3a-3b), whereas the other rigid body is denoted with reference numeral 20 (reference numeral 20a-20b in FIGS. 2a-2b and reference numerals 110-120 in FIGS. 3a-3b).

The magnetic bearing assembly 10 comprising: at least one bearing module 31-34 being mounted to one 30 of said rigid bodies and consisting of at least a ferromagnetic core 31. For the sake of the understanding of the invention it should be noted that any ferromagnetic core design can be implemented. However in this favorable example the ferromagnetic core 31 is an E-core having a base 31a, a center leg 33 and two outer legs 32a-32b. On a first side of the ferromagnetic core 31 a first magnetic element 34 is positioned and in this example the first end of the ferromagnetic core 31 is defined being located at the free end face 33a of the central leg 33. Also in this example a coil 35 is wound around the center leg 33 of the E-core.

However it is noted that any ferromagnetic core design having a coil wound around its core element and a magnetic element positioned on a first side of the ferromagnetic core can be implemented in the magnetic bearing assembly 10 according to the invention.

In addition the magnetic bearing assembly 10 exhibits at least a first static back iron or back bearing 20 being mounted to (or being part of) the other one of said rigid bodies 20 and positioned, during use, at some gap distance 40, indicated with g1 in FIG. 1, from said one bearing module 31-34.

Preferably, but no necessarily the ferromagnetic core being designed as an E-core 31 consists of a laminated E-core and the first magnetic element 34 is construed as a permanent magnet 34.

During use or during operation, the first static back bearing or back iron 20 is placed at a gap distance 40 (g1) from the E-core assembly 31-34-35. This configuration defines a low reluctance path, where the resulting magnetic flux density in the air gap g1 defined by the gap distance 40 will yield a gap dependent attraction force between the E-core assemble 31-34-35 (and as such the one rigid body 30) relative to the other rigid body, which is schematically depicted as the first static back bearing (back iron) 20.

The coil 35 being wound around the central leg or tooth 35 of the E-core 31 is used to either magnify or reduce the magnetic flux density in the air gap g1 (40), based on the direction and magnitude of an electric current running through the coil 35. It is noted, that the magnetic bearing assembly 10 (in fact the at least one bearing module 31-34-51) can only generate an attraction force and no repelling force between the E-core 31 and the first static back bearing (back iron) 20.

Figure 2A:
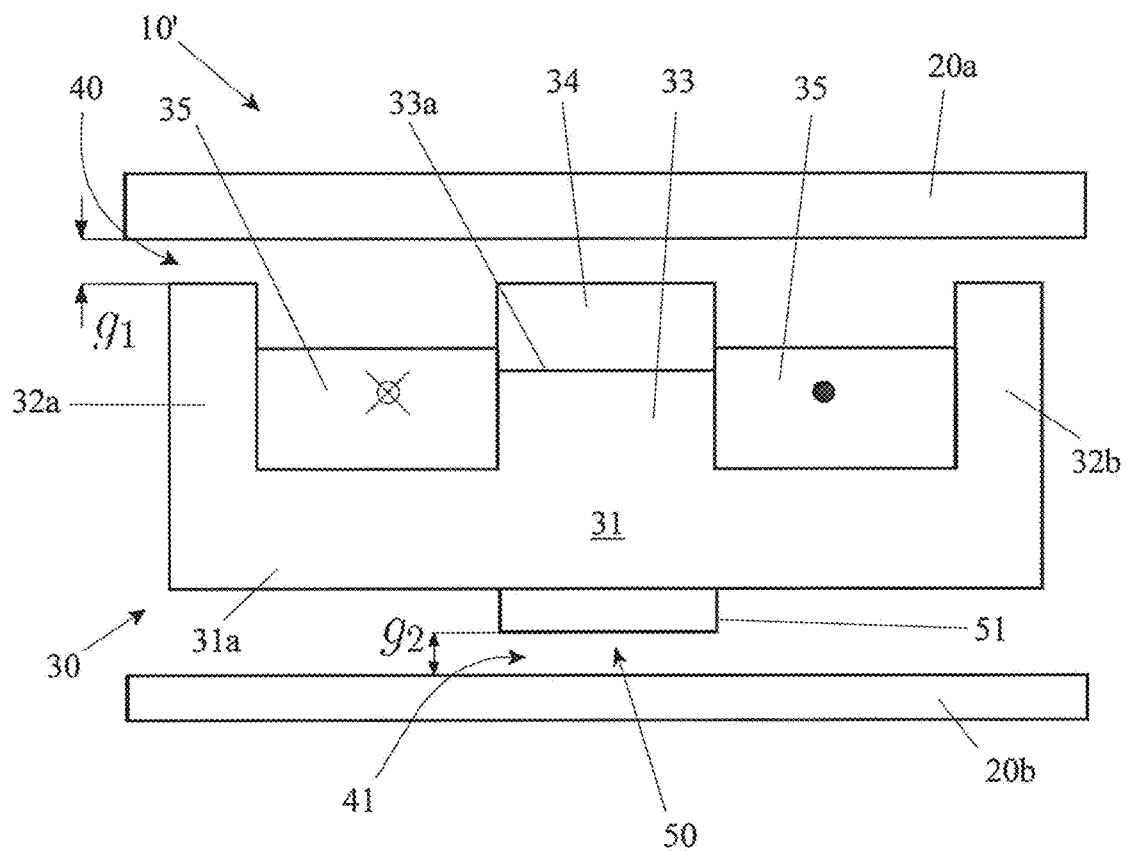
FIG. 2a a schematic example of another embodiment of a magnetic bearing assembly according to the invention.
Figure 2B:
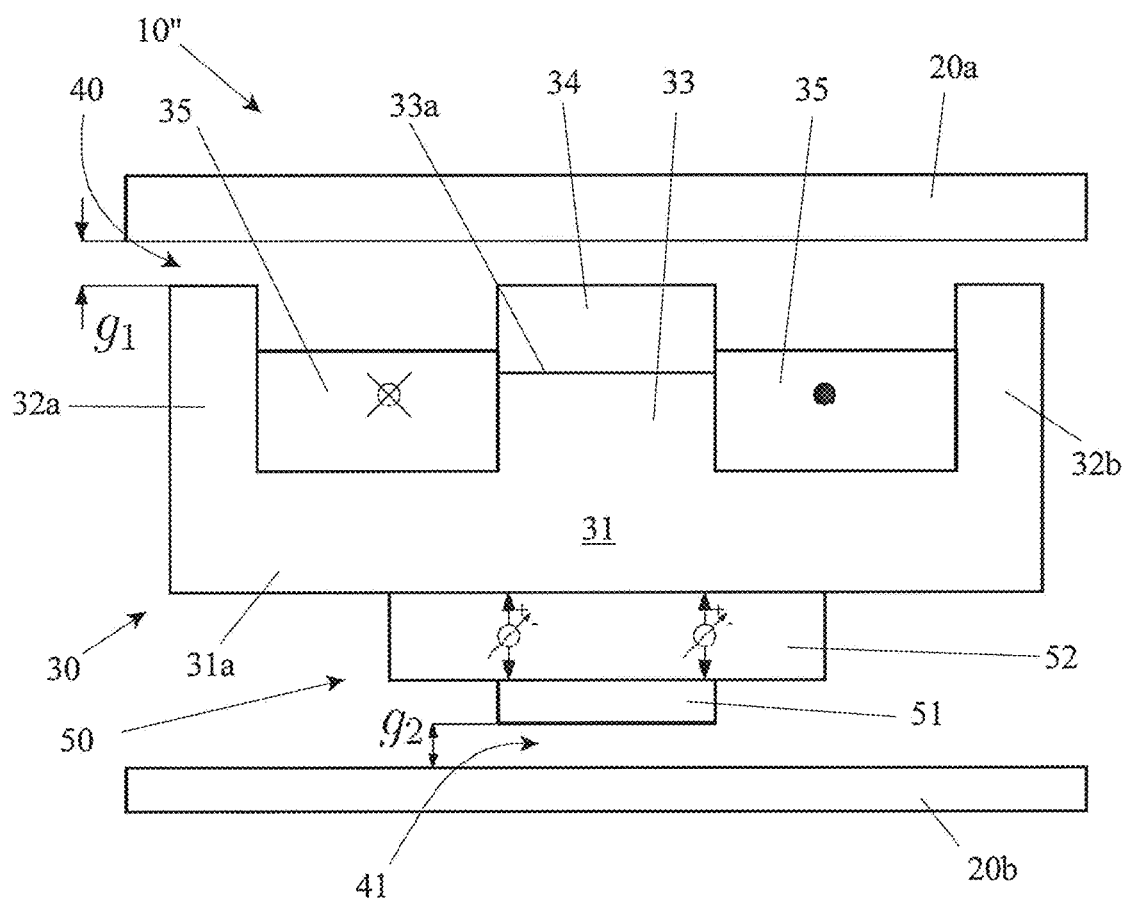
FIG. 2b a schematic example of yet another embodiment of a magnetic bearing assembly according to the invention.

In FIGS. 2a-2b another example of a magnetic bearing assembly (denoted with 10') is shown. In this embodiment the magnetic bearing assembly 10' is provided with an additional setting module 50, which setting module 50 is positioned opposite to the first magnetic element side 33a-34 of the E-core 33. Preferably but not necessarily the setting module 50 comprises a second magnetic element 51.

The setting module 50 provides or applies a constant pre-load to the magnetic bearing assembly 10' in the direction opposite to that of the attraction force as generated by the E-core 31 and first magnet 34. The resulting net force on the magnetic bearing module 31-34-50 as such can be controlled, and thereby also the position (in fact the distance g1) of the rigid body 30 to which the magnetic bearing module 31-34-50 is mounted relative to a further static back iron 20b being mounted to or being part of the other one (20a-20b) of said rigid bodies.

It is noted, that in FIGS. 2a-2b both reference numerals 20a-20b are considered representing constructional elements which are part of one and the same rigid body as defined in the pending claims, whereas reference numeral 30 constitutes the other rigid body and that the magnetic bearing assembly as described herein allows contactless linear displacement of one of said rigid bodies (20a-20b or 30) relative to another rigid body (30 or 20a-20b) along a linear displacement path.

Depending on the orientation of the bearing module 31-34-50 being mounted to one 30 of said rigid bodies (20a-20b; 30), gravity (based on the weight of the magnetic bearing module 31-34-50) could provide at least part of this pre-load.

As such reference numeral 20a defines the first static back bearing or back iron, whereas reference numeral 20b defines the further static back bearing or back iron.

The pre-load can be enhanced by constituting said setting module 50 as a second magnet 51, being positioned on the opposed side of the E-core/spoil/first magnet configuration 33-35-34, as shown in FIG. 2a. In particular the second magnet 51, which could a permanent magnet 51 can be mounted to the other side of the E-core 31 in particular to the other side of the base 31a.

This second (permanent) magnet 51 will create a preload force in the air gap g2 (41) between the magnetic bearing module 31-34-35-50 mounted on one of the rigid bodies 30 and the other one 20b of the rigid bodies. the other one 20b of the rigid bodies. Energy dissipation of the bearing module can be minimized by tuning the magnetic pre-load force as exerted by the setting module 51, such that all static forces are balanced. In this case, the electromagnet (E-core 31 and spoil 35) is only required to counteract dynamic disturbances during the linear displacement of the one rigid body 30 relative to the other rigid body 20a-20b. Manufacturing tolerances and the relatively large variations on the dimensions and magnetic moment of permanent magnets may introduce deviations from this static force balance.

In a further example 10" of the magnetic bearing assembly according to the invention (see FIG. 2b) the setting module 50 comprises, next to the second permanent magnet 51, a controllable adjustment mechanism 52 being positioned between the base 31a of the E-core 31 and the second (permanent) magnet 51. Herewith a preset of the distance or the air gap g2 (41) between the magnetic bearing module 31-34-35-50 mounted on one of the rigid bodies 30 and the other one 20b of the rigid bodies is possible, thereby allowing to tune the pre-load force, such that the static forces exerted by both the first and second magnets 34-51 are balanced and any energy dissipation is minimized.

Combining this example with a position sensor (or a flux sensor) and motion control software (not shown), consisting of a current control loop and a position control loop, the air gap 40 (g1) between the magnetic bearing module 31-34-35 and the first static back iron 20 being mounted to the other one of said rigid bodies can be actively controlled to compensate for dynamic disturbance forces occurring during the linear displacement of one of the rigid bodies relative to the other one of the rigid bodies (30; 20a-20b) by regulating the current through the electromagnet 33-35.

For the sake of compact construction and avoidance of particle contamination (cleanliness), the entire magnetic bearing module 31-34-35-50 can be enclosed in a non-magnetic material (see FIG. 4), for example stainless steel or a resin, and subsequently mounted to either of the rigid bodies 20a-20b; 30 as for example shown in the application embodiment of FIGS. 3a-3b.

Figure 3A:
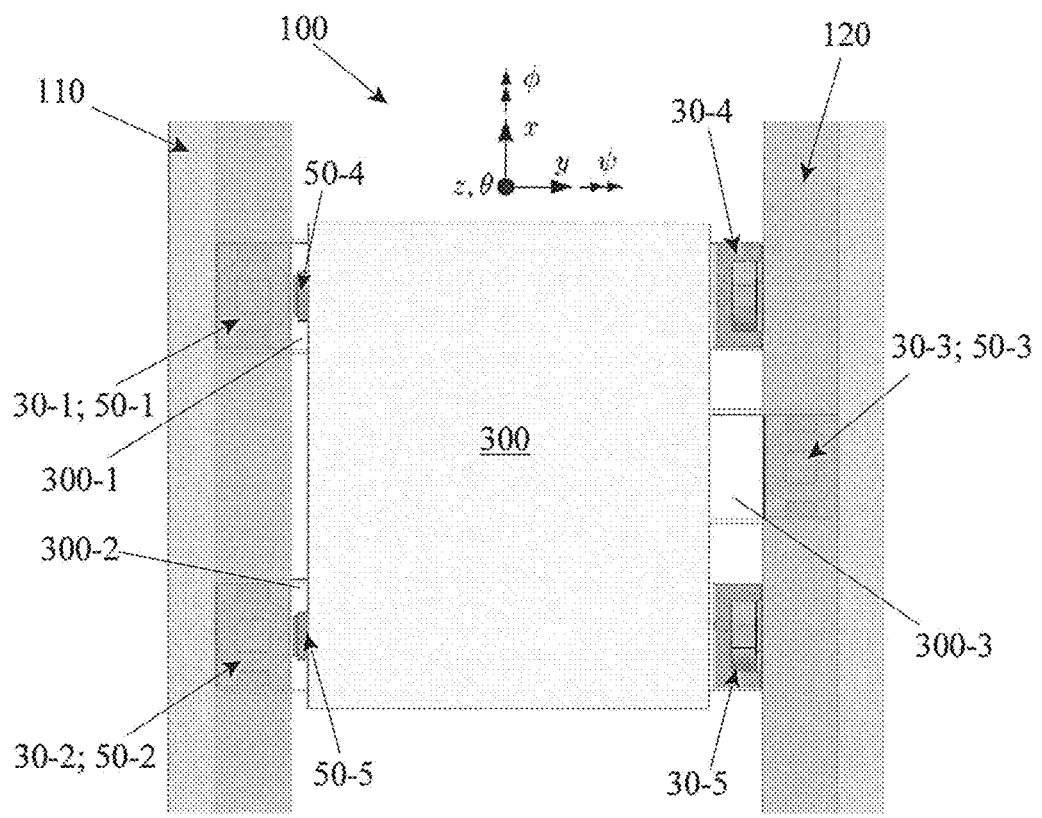
FIG. 3a a view of a schematic example of an embodiment of a linear guideway assembly implementing multiple magnetic bearing assemblies according to the invention.
Figure 3B:
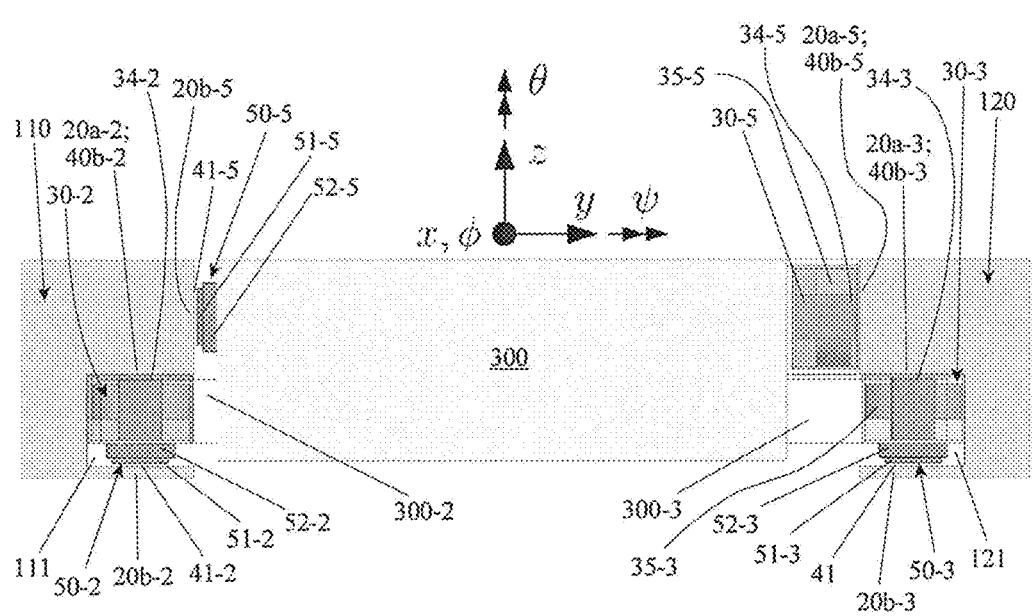

In FIGS. 3a-3b an example is depicted of an implementation or application of multiple magnetic bearing assemblies. In this non-limitative example a total of five magnetic bearing assemblies 30-1+50-1; 30-2+50-2; 30-3+50-3; 30-4+50-4; 30-5+50-5 are shown, which are interacting with rigid bodies 110-120 and 300.

It is noted, that in FIGS. 3a-3b both reference numerals 110-120 (and 20a-20b) are considered representing constructional elements which are part of one and the same rigid body as defined in the pending claims, whereas reference numeral 300 constitutes the other rigid body and that the magnetic bearing assemblies 30-1+50-1; 30-2+50-2; 30-3+50-3; 30-4+50-4; 30-5+50-5 as described herein allows contactless linear displacement of one of said rigid bodies (20a-20b;110-120 or 300) relative to another rigid body (300 or 20a-20b;110-120) along a linear displacement path.

As such reference numeral 20a-X (with X being 1, 2, 3, 4, 5 in this example of five magnetic bearing assemblies) defines the first static back bearing or back iron, whereas reference numeral 20b-X (with X being 1, 2, 3, 4, 5) defines the further static back bearing or back iron for each of the magnetic bearing assemblies 30-X+50-X (with X representing 1, 2, 3, 4 or 5 in this example of five magnetic bearing assemblies).

In particular this example depicts a view from above (FIG. 2a) and a frontal view (FIG. 2b) of a linear guideway assembly 100 being composed of a rigid body 110-120 formed as a linear guideway defining a linear displacement path as well as one or more rigid bodies 300 formed as product carriers being displaceable along or between said linear guideway 110-120. The linear guideway assembly further comprises one or more (here five) magnetic bearing assemblies 30-1+50-1; 30-2+50-2; 30-3+50-3; 30-4+50-4; 30-5+50-5 according to any one or more of the examples of FIGS. 1; 2a-2b.

Figure 4:
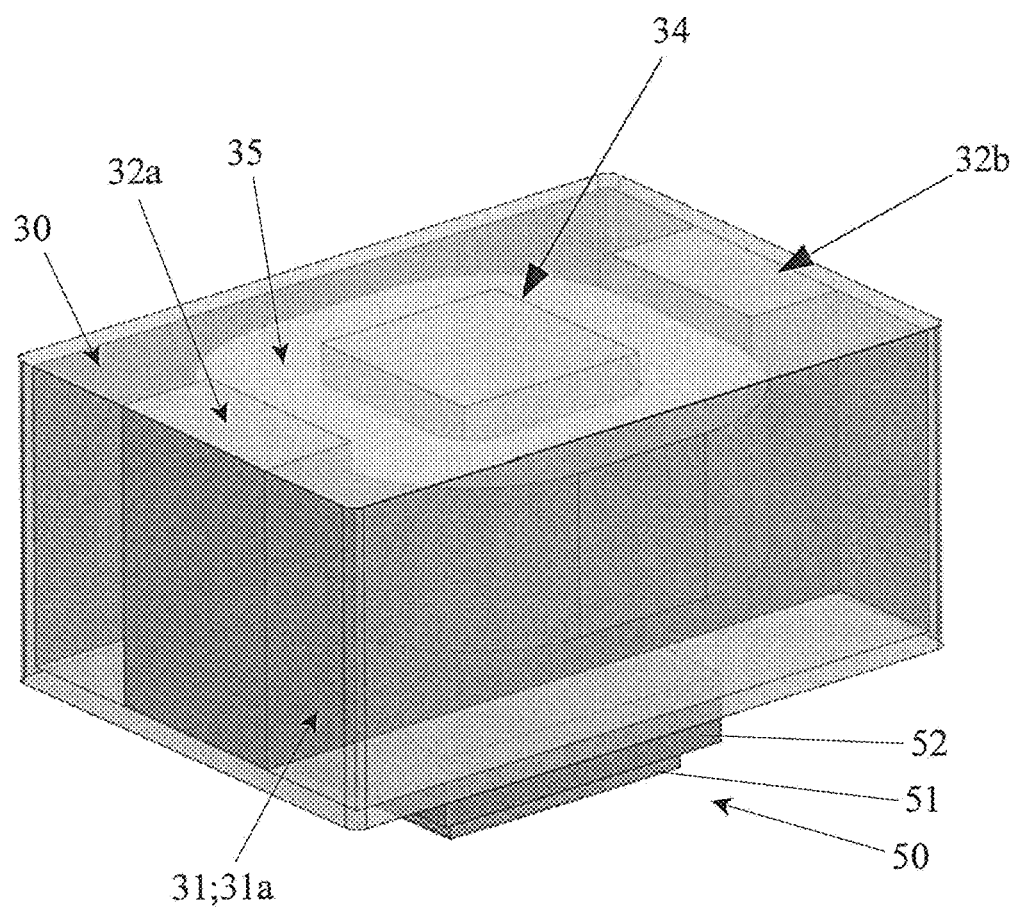
FIG. 4 a compact construction of an example of a magnetic bearing module.

The linear guideway assembly 100 comprises two guide rails 110-120 which are positioned parallel and at some distance from each other. In this non-limitative example each guide rail 110-120 is provided with a guidance recess 111-121, which extends in the longitudinal direction of each guide rail 110-120. Both guide recesses 111-121 are positioned such that they are facing each other. Both guide recesses 111-121 serve to accommodate one or more (here three) magnetic bearing assemblies 30-1+50-1; 30-2+50-2; 30-3+50-3, which are accommodated as an enclosed module as depicted in FIG. 4, and which magnetic bearing assemblies 30-1+50-1; 30-2+50-2; 30-3+50-3 are mounted to carrier supports 300-1; 300-2; 300-3 of a product carrier 300, which product carrier 300 is mounted between and guided along a linear guideway formed by both guide rails 110-120.

It is noted that the product carrier 300 constitutes one of the rigid bodies and the guide rails 110-120 constitute the other one of the rigid bodies as defined in the pending claims and as clarified in relation to the example of FIG. 2a-2b. In particular in this example of a linear guideway assembly 100 the several bearing assemblies 30-1+50-1; 30-2+50-2; 30-3+50-3; 30-4+50-4; 30-5+50-5 are implemented in a straight guideway with a displacement stroke of for example 600 mm, as part of a substrate carrier handling robot in a high cleanliness substrate handling environment. The straight guide must constrain five degrees of freedom of a carrier with respect to a displacement beam (not shown) being part of a proceeding link or arm of the robot. In this example five magnetic bearing assemblies 30-1+50-1; 30-2+50-2; 30-3+50-3; 30-4+50-4; 30-5+50-5 are applied, as an alternative to a concept containing one or two conventional profiled guide- or railways.

Three magnetic bearing assemblies 30-1+50-1; 30-2+50-2; 30-3+50-3; constrain the out of plane degrees of freedom of the carrier 300 with respect to the guide rails 110-120, namely the z, Φ and ψ directions. Two additional magnetic bearing assemblies 30-4+50-4; 30-5+50-5 impose the remaining in-plane degrees of freedom y and ⊖.

Any pre-loading as described above for the three out of plane magnetic assemblies 30-1+50-1; 30-2+50-2; 30-3+50-3 is performed with their respective setting modules 50-1;50-2;50-3 at their bottom sides 31a of the respective E-cores 31. Also in this example the preloading consists of a (permanent) magnet 51-1;51-2;51-3 which are each mounted to an adjustment mechanism 52-1;52-2-52-3, which can be a mechanical setting mechanism for pre-setting an air gap distance g2 (41-1;41-2;41-3) between each magnetic assemblies (mounted to a rigid body or product carrier 300) and the other rigid body (guide rail) 110-120, in particular a guide flange 20b-2; 20b-3 enclosing the guide recess 111-121.

Similarly the electromagnet formed by the E-core 31 and coil 35 of each magnetic assemblies 30-1; 30-2; 30-3 together with their respective first permanent magnets 34-1; 34-2; 34-3 pre-set and control the air gap distance g1 (40b-1; 40b-2; 40b-3) between the product carrier 300 and the guide rails 110-120.

The in-plane degree of freedom are pre-loaded by the two magnetic assemblies 30-4+50-4 and 30-5+50-5. Here the setting modules 50-4 and 50-5 as well as the magnetic bearing modules 30-4 and 30-5 (each composed of the E-cores 31, the coil 35 and the first permanent magnets 34-4 and 34-5 respectively) are mounted on the opposed sides of the product carrier 300 controlling or maintaining a desired air gap 20b-5 and 20a-5 between the product carrier and each guide rail 111 and 121 respectively.

In contrast to conventional rolling element linear bearings where five degrees of freedom are constrained, the five constrained degrees of freedom can be controlled actively using the active controllable magnetic bearing assemblies 30-1+50-1; 30-2+50-2; 30-3+50-3; 30-4+50-4; 30-5+50-5 and thereby correct for undesired dynamic behavior of the robot, which is displacing the product carrier 300 between the two guide rails 110-120 of the linear guideway assembly 100.

The examples above of magnetic bearing assemblies as defined in the pending claims are highly suitable for implementation on a commercial scale in high cleanliness substrate handling robotic application. The magnetic bearing assemblies of the present invention can be constructed with limited dimension and at low costs and be easily implemented in a thermally critical system and vacuum environment, such as a substrate wafer handling application, where a stable and well-controlled linear displacement of one rigid body (a substrate carrier 300) relative to another rigid body (the guide way assembly 110-120) is essential for quality assurance purposes.

In particular the magnetic bearing assembly as proposed allow for displacement stability, stiffness and energy dissipation in such thermally critical systems and vacuum environments which is not possible with commonly known rolling bearings.

The invention claimed is:

1. A magnetic bearing assembly for contactless linear displacement of a rigid body relative to another rigid body along a linear displacement path, said magnetic bearing assembly comprising:
    at least one magnetic bearing module being mounted to one of said rigid bodies and consisting of at least: a ferromagnetic core; a first magnetic element positioned on a first side of said ferromagnetic core; and a coil being wound around said ferromagnetic core; and
    at least a first static back iron being mounted to the other one of said rigid bodies and positioned, during use, at some gap distance from said one at least bearing module wherein the at least one magnetic bearing module further includes a setting module positioned on another side of the ferromagnetic core opposite to the first side, and wherein said setting module comprises a second magnetic element,
    wherein said at least one bearing module includes a second static back iron being mounted to the other one of said rigid bodies and positioned, during use, at some gap distance from said setting module,
    wherein said setting module is arranged in setting said gap distance between the at least one magnetic bearing module and said second static back iron being mounted to the other one of said rigid bodies,
    wherein said setting module is a controllable setting module.

2. The magnetic bearing assembly according to claim 1, wherein said first static back iron is positioned at the first side of the ferromagnetic core.

3. The magnetic bearing assembly according to claim 1, wherein the ferromagnetic core is an E-core having a base, a center leg and two outer legs.

4. The magnetic bearing assembly according to claim 3, wherein the first magnetic element positioned on the central leg.

5. The magnetic bearing assembly according to claim 3, wherein the coil is wound around the center leg.

6. The magnetic bearing assembly according to claim 3, wherein the E-core is a laminated E-core.

7. The magnetic bearing assembly according to claim 1, wherein the first magnetic element is a permanent magnet.

8. The magnetic bearing assembly according to claim 1, wherein the second magnetic element is a permanent magnet.

9. A linear guideway assembly being composed of a rigid body formed as a linear guideway defining a linear displacement path as well as one or more rigid bodies formed as product carriers being displaceable along said linear guideway, wherein said linear guideway assembly further comprises said one or more magnetic bearing assemblies according to claim 1.

* * * * *